United States Patent
Pokharna et al.

(10) Patent No.: US 6,958,912 B2
(45) Date of Patent: Oct. 25, 2005

(54) ENHANCED HEAT EXCHANGER

(75) Inventors: Himanshu Pokharna, San Jose, CA (US); Anandaroop Bhattacharya, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 10/716,734

(22) Filed: Nov. 18, 2003

(65) Prior Publication Data

US 2005/0103480 A1 May 19, 2005

(51) Int. Cl.$^7$ .............................................. H05K 7/20
(52) U.S. Cl. ...................... 361/700; 361/697; 361/704; 257/712; 257/715; 174/15.2; 165/80.4; 165/104.26; 165/185
(58) Field of Search ................................ 361/702–712, 361/695–697; 257/706, 712–714; 174/15.1, 174/15.2, 16.3; 165/80.3, 80.4, 185

(56) References Cited

U.S. PATENT DOCUMENTS

| | | | | |
|---|---|---|---|---|
| 4,568,595 | A * | 2/1986 | Morris ......................... | 428/116 |
| 6,185,810 | B1 * | 2/2001 | Gubser et al. ................ | 29/599 |
| 6,421,239 | B1 * | 7/2002 | Huang ......................... | 361/696 |
| 6,424,529 | B2 * | 7/2002 | Eesley et al. ................ | 361/703 |
| 6,424,531 | B1 * | 7/2002 | Bhatti et al. ................. | 361/704 |
| 6,591,897 | B1 * | 7/2003 | Bhatti et al. ................ | 165/80.3 |
| 6,761,211 | B2 * | 7/2004 | Bhatti et al. ................ | 165/80.3 |
| 6,840,307 | B2 * | 1/2005 | Eesley et al. ............... | 165/80.3 |
| 2002/0108743 | A1 * | 8/2002 | Wirtz .......................... | 165/185 |

OTHER PUBLICATIONS

Bhattacharya, A and Mahajan, R.L., "Finned Metal Foam Heat Sinks for Electronics Cooling in Forced Convection", ASME Journal of Electronic Packaging, vol. 124, (3), Sep. 2002, pp. 155-163.

* cited by examiner

Primary Examiner—Boris Chervinsky
(74) Attorney, Agent, or Firm—Buckley, Maschoff & Talwalkar LLC

(57) ABSTRACT

According to some embodiments, an enhanced heat exchanger may be provided. The enhanced heat exchanger may comprise, for example, a heat transfer portion to receive heat from a heat source and to transfer heat from the heat source, and a remote heat sink adjacent to the heat transfer portion to remove heat from the heat transfer portion. In some embodiments, the remote heat sink may comprise a solid metal portion that extends away from the heat transfer portion, and a porous medium coupled to the solid metal portion. According to some embodiments, the porous medium may extend away from the solid metal portion such that a thermal boundary layer exists in substantially the entire porous medium.

25 Claims, 5 Drawing Sheets

ENHANCED HEAT EXCHANGER

BACKGROUND

Heat generated by electronic devices and other equipment may be dissipated to allow for efficient operation and to prevent damage to components. In some applications, a heat exchanger or heat sink may be used to effectuate the dissipation of heat. Forced convection may also be employed to enhance the performance of the heat exchanger.

The amount of heat that can be dissipated may increase with the size and/or surface area of the heat exchanger. Where space constraints limit the size of a heat exchanger, the efficiency of the heat exchanger may become important. Some devices, for example, might be limited in speed or functionality because higher power components would generate more heat than could be effectively dissipated by a heat exchanger of a given size.

DETAILED DESCRIPTION

Some embodiments described herein are associated with a "heat exchanger" or a "heat sink". As used herein, the terms "heat exchanger" and "heat sink" may be used interchangeably and generally refer to any apparatus, device, system, or object for dissipating, removing, and/or otherwise eliminating heat. By way of example, a heat exchanger may be a longitudinal finned metal heat sink used to cool a processor or another electronic device component.

In addition, some embodiments are associated with a "heat transfer device." As used herein, the phrase "heat transfer device" may refer to any device adapted to move, transfer, and/or otherwise relocate heat. Examples of heat transfer devices may include, but are not limited to, heat pipes, pumped loops, and/or refrigeration loops. In some embodiments for example, a heat exchanger may be a heat pipe for transferring heat from a processor to a heat sink.

Although a heat transfer device may also act as a heat exchanger or heat sink, as used herein the term "heat transfer device" generally refers to a device, apparatus, component, and/or object that is primarily used to move or relocate heat within an electronic or other device. The actual or majority of heat dissipation might be accomplished, for example, by a finned heat sink attached to the heat transfer device.

Figure 1:
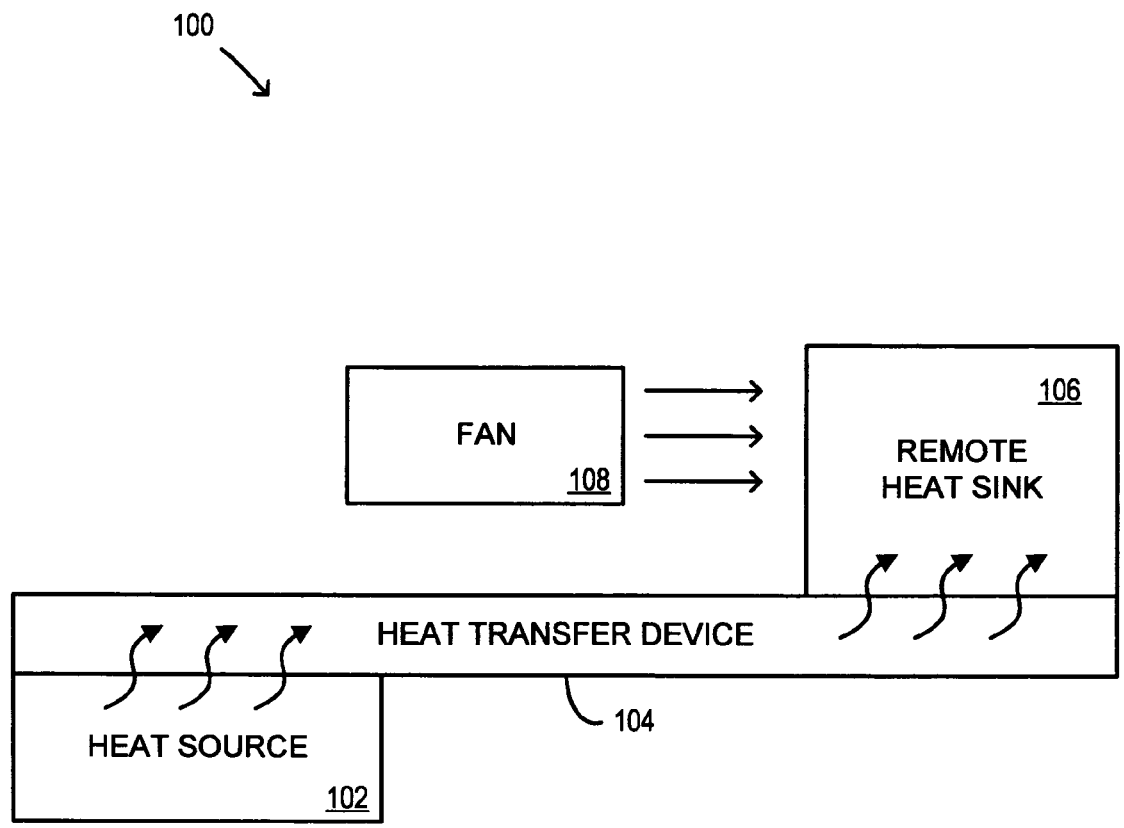
FIG. 1 is a block diagram of an apparatus.

Referring first to FIG. 1, a block diagram of an apparatus 100 for dissipating heat is depicted for use in explanation, but not limitation, of described embodiments. Upon reading this disclosure, those skilled in the art will appreciate that different types, shapes, and configurations of apparatus and systems may be used.

In electronic systems such as notebook or portable computers, heat may need to be dissipated from various electronic components. For example, a heat source 102 may generate heat that must be dissipated from a notebook computer. Because vertical or head space may be limited in the casing of a notebook computer, there might not be enough room to place a heat sink directly on or attached to the heat source 102. Because a heat transfer device 104 may take up less vertical space than a heat sink, the heat transfer device 104 may be used to transfer heat generated by the heat source 102 to a different location within, adjacent, or even external to the notebook computer. The alternate location may, for example, contain sufficient vertical space in which to locate a remote heat sink 106. Air may be forced toward, through, and/or over the remote heat sink 106 by a fan 108 to enhance the heat dissipation of the remote heat sink 106. The fan 108 may also or alternatively expel heat and/or heated air from, for example, the notebook computer.

The heat source 102 may be any device, element, object, and/or area that produces, emanates, and/or contains heat. In the case of a notebook computer, for example, the heat source 102 may be or include a processor such as a Mobile Intel® Pentium® 4 Processor or a Mobile Intel® Pentium® 4 Processor—M coupled with a Mobile Intel® 845 family chipset. The heat transfer device 104 may be any device for transferring heat away from the heat source 102 that is known, available, and/or described herein. The heat transfer device 104 may, for example, be a heat pipe. The remote heat sink 106 may generally be a metal finned heat sink of various sizes, shapes, and/or configurations. The remote heat sink 106 may be attached to a remote end and/or portion of the heat transfer device 104. The fan 108 may be any type of device for causing air to flow toward and/or over the remote heat sink 106. The fan 108 may, for example, be a standard axial-flow fan or a blower fan.

Figure 2:
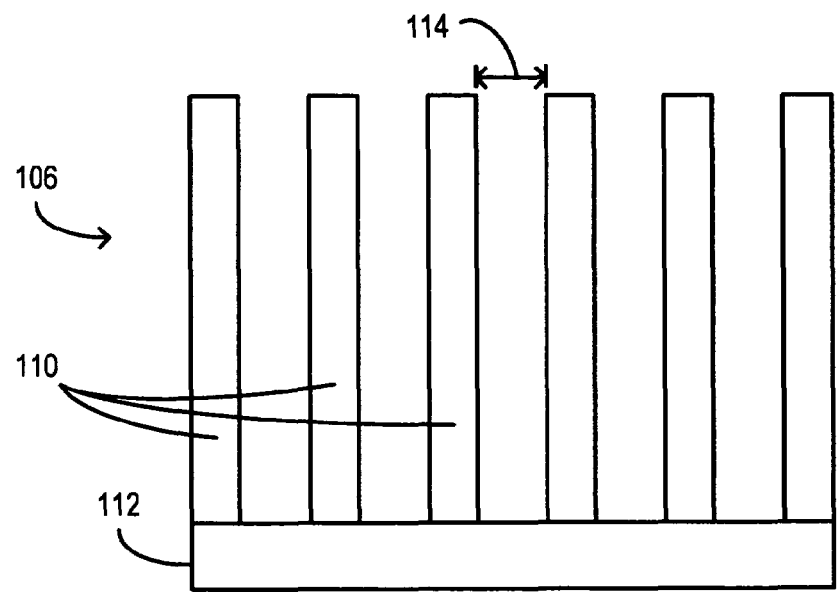
FIG. 2 is a block diagram of a heat sink.

FIG. 2 shows an exemplary remote heat sink 106 that may be used, for example, in the apparatus 100. The remote heat sink 106 is shown in FIG. 2 as a longitudinal finned metal heat sink having multiple metal fins 110 protruding longitudinally from a heat sink base 112. The fins 110 are oriented in parallel to each other and are arranged to provide a uniform lateral spacing or gap 114. The remote heat sink 106 may have fewer or more parallel fins than shown in FIG. 2, and the fins may also be arranged in various orientations known to those skilled in the art. The fins 110 may be composed of any known or available thermally conductive material including metals such as copper. The base 112 of the remote heat sink 106 may be a solid metal surface attached to and/or placed adjacent to the remote end and/or portion of the heat transfer device 104. The base 112 may also be or include the remote end and/or portion of the heat transfer device 104.

Heat generally flows into the base 112 from the heat transfer device 104. The heat may then travel upward through the parallel fins 110. The fins 110 provide extensive surface area over which the remote heat sink 106 may release heat into the surrounding environment. The fan 108 described with respect FIG. 1 may be used to force air between the fins 110, expelling heated air and promoting greater remote heat sink 106 efficiency.

Figure 3:
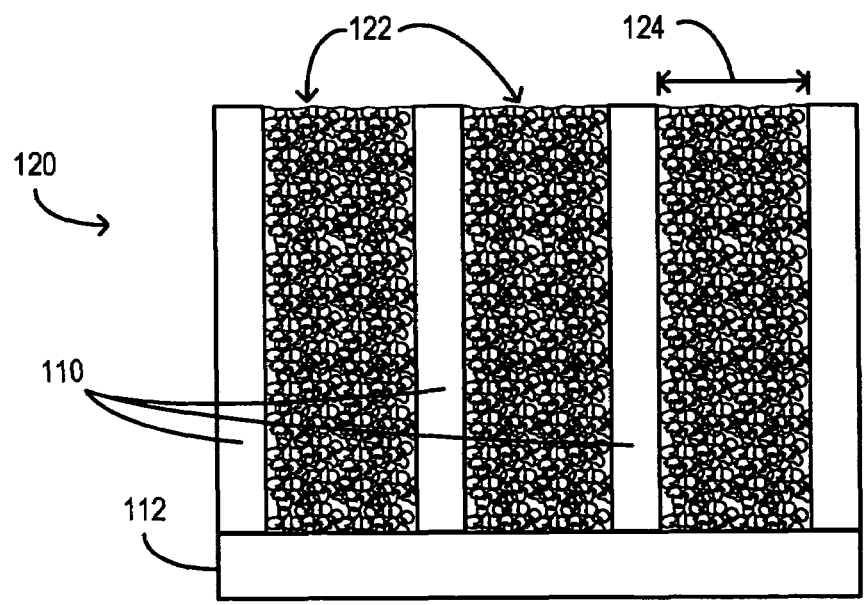
FIG. 3 is a block diagram of a heat exchanger according to some embodiments.

Turning to FIG. 3, a block diagram of a heat exchanger 120 in accordance with some embodiments is shown. The heat exchanger 120 may, according to some embodiments, have a base 112 and fins 110 similar to those described with respect to the remote heat sink 106 herein. Fewer or more fins 110 than shown in FIG. 3 may be used in some embodiments. The heat exchanger 120 may also have a porous medium 122 attached and/or otherwise located between adjacent fins 110. The porous medium 122 may be any known or available type of porous medium including, but not limited to, cellular or porous metals, metal foams, and metal sponges. Generally, any thermally conductive material that contains voids may be used as the porous medium 122.

In some embodiments, the porous medium 122 may be forced, under compressive load, between adjacent fins 110. Forcing the porous medium 122 into the space between adjacent fins 110 may result in good thermal contact and/or thermal coupling between the porous medium 122 and each of the metal fins 110. Another method of providing good thermal contact between the porous medium 122 and the fins 110 may be to heat the fins 110 and/or the heat exchanger 120 (without the porous medium 122), place the porous medium 122 between adjacent fins 110, and allow the fins 110 and/or heat exchanger 120 to cool. The heating of the fins 110 and/or heat exchanger 120 widens the gap 124 between adjacent fins 110, permitting a properly sized portion of porous medium 122 to be placed between the fins 110. The cooling allows the gap 124 to narrow, compressing the porous medium 122 between adjacent fins 110. Other attachment methods such as using thermally conductive adhesive to bond the porous medium 122 to the fins 110 may also be employed to assemble the heat exchanger 120. In some embodiments, the porous medium may be attached and/or thermally coupled to a single fin 110. Also according to some embodiments, the porous medium 122 may be thermally coupled to and/or otherwise attached to the base 112.

The porous medium 122 may generally have a very large surface area and therefore may provide very efficient heat dissipation. The tortuous path that heat may need to take to travel through the porous medium 122 may however generally limit the thermal conductivity from one end of the porous medium 122 to the other. For example, heat traveling from the base 112 into the porous medium 122 may only be able to travel a short distance into the porous medium 122 proximate to the base 112 prior to being dissipated. This may thermally isolate the remaining portions of the porous medium 122 that are distal from the base 112, rendering them ineffective for heat dissipation.

According to some embodiments however, the thermal conductivity of the metal fins 110 is very high, allowing heat to travel easily to the tips of the fins 110. Good thermal contact and/or thermal coupling between the fins 110 and the porous medium 122 may allow heat to flow into the porous medium 122 from any point along the length of the fins 110, including from the tips of the fins 110 into the portions of the porous medium 122 most distal from the base 112. The majority of or all of the porous medium 122 may therefore be utilized to greatly enhance the efficiency of the heat exchanger 120.

In some embodiments, the use of the porous medium 122 may provide a gap 124 that may be optimally sized for thermal dispersion. For example, a heat sink 106 such as depicted in FIG. 2 may generally have an optimal fin spacing 114. The optimal lateral spacing 114 may often be too small to effectively manufacture (e.g., smaller than the manufacturing tolerances and/or capabilities). This may occur, for example, where the fin spacing 114 is required to be reduced below manufacturing capabilities in order to minimize resistance in systems using forced convection. In such circumstances, the heat sink 106 can not be manufactured in an optimal configuration for increased heat dissipation efficiency. In some embodiments however, the porous medium 122 may provide an optimal spacing 124 for the heat exchanger 120 that is larger than the optimal spacing 114 for a heat sink 106.

For example, the thermal boundary layers within the porous medium 122 may be larger than those possible when air flows in a free stream between fins 110 (i.e., as in a heat sink 106). Optimal fin 110 spacing may generally be considered to have a direct relationship with the thickness of the thermal boundary layer. Thus, use of a porous medium 122 between fins 110 may provide for an optimal spacing 124 that may be within manufacturing limits. Further, increased lateral spacing 124 may reduce the total number of fins 110 required for a heat sink of a given size. As shown in FIGS. 2 and 3 for example, the heat sink 106 and the enhanced heat exchanger 120 are the same size, yet the heat sink 106 has six fins 110, while the enhanced heat exchanger 120 has only four fins 110. Fewer fins 110 may result in more simplified manufacturing and thus may reduce manufacturing costs. Some embodiments therefore provide an enhanced heat exchanger 120 that may be manufactured with a fin spacing 124 optimized for heat dissipation efficiency. Such an enhanced heat exchanger 120 may also be more easily and more cheaply manufactured than standard heat sinks. Those skilled in the art will recognize that various known and/or available fin 110 types and orientations may be used in conjunction with the porous medium 122 to provide an enhanced heat exchanger 120.

Figure 4:
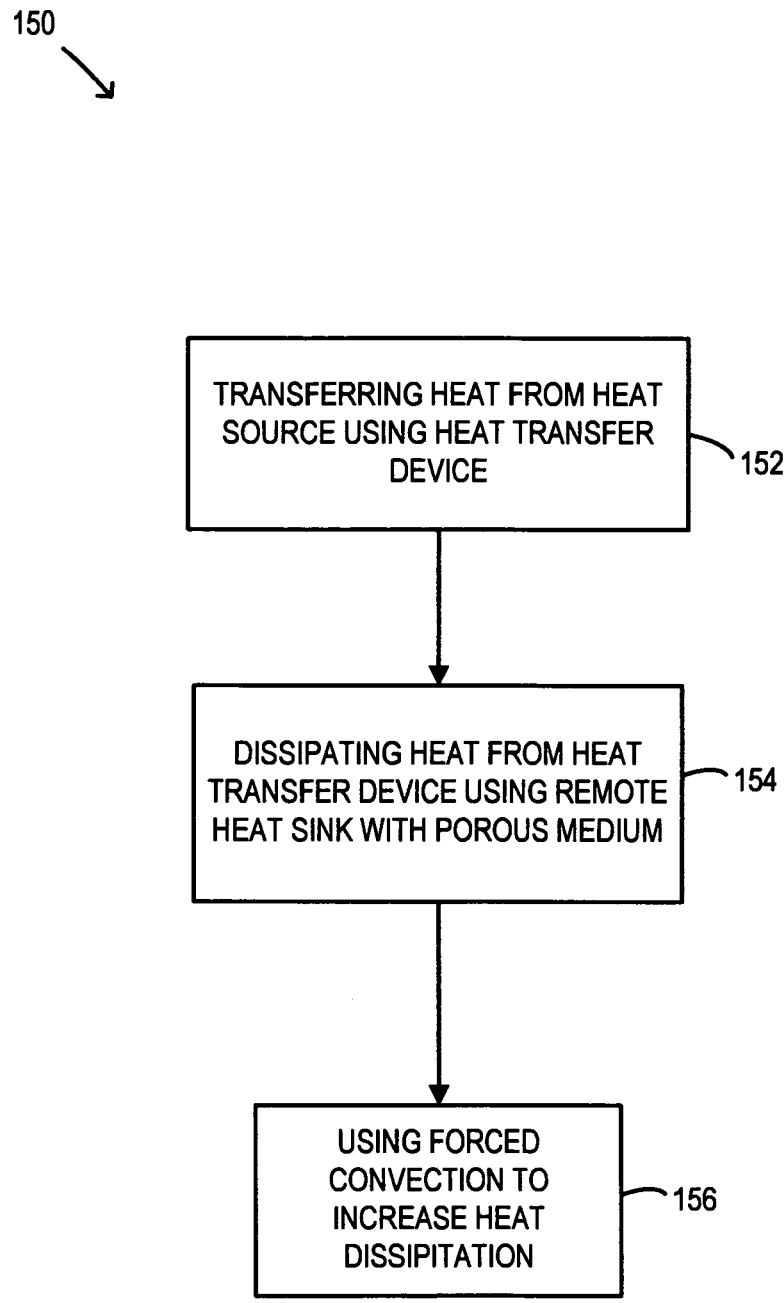
FIG. 4 is a block diagram of a method according to some embodiments.

FIG. 4 is a flowchart of a method 150 in accordance with some embodiments. The method 150 may be practiced, for example, by the apparatus 200 or by the system 250 described in conjunction with FIGS. 5 and 6 herein. In some embodiments, other systems and/or apparatus may be used to process the method 150. The method 150 may begin at 152 by transferring heat from a heat source using a heat transfer device. For example, the heat generated by a microprocessor in a notebook computer may be taken up by a heat pipe attached to the processor. The heat may then be transferred from the end of the heat pipe adjacent to the processor to a remote end of the pipe. Attached to the remote end of the heat pipe may be one or more remote heat exchangers utilizing a porous medium. In some embodiments, the remote heat exchanger may be an enhanced heat exchanger 120 as described herein in conjunction with FIG. 3. At 154 the remote heat exchanger may take up the heat from the heat transfer device and dissipate it into the surrounding environment. In a notebook computer application for example, the remote heat exchanger may dissipate heat from the heat transfer device into the air within the notebook casing.

In some embodiments, forced convection may be used to increase the heat dissipation of the remote heat exchanger, at 156. For example, a blower fan may be mounted within a notebook casing near the remote heat exchanger. According to some embodiments, a blower fan may be used to reduce the amount of vertical space needed and/or taken up within the notebook casing. Axial-flow fans, for example, may be required to be mounted above the remote heat exchanger (taking up vertical space within the notebook casing) in order to force air through or withdrawal air from the remote heat exchanger. The blower fan may direct air through the porous medium of the remote heat exchanger, expelling heated air from the remote heat exchanger and thus enhancing the efficiency of the remote heat exchanger. The blower fan may also be used, for example, to expel heated air from the casing of the notebook computer.

Figure 5:
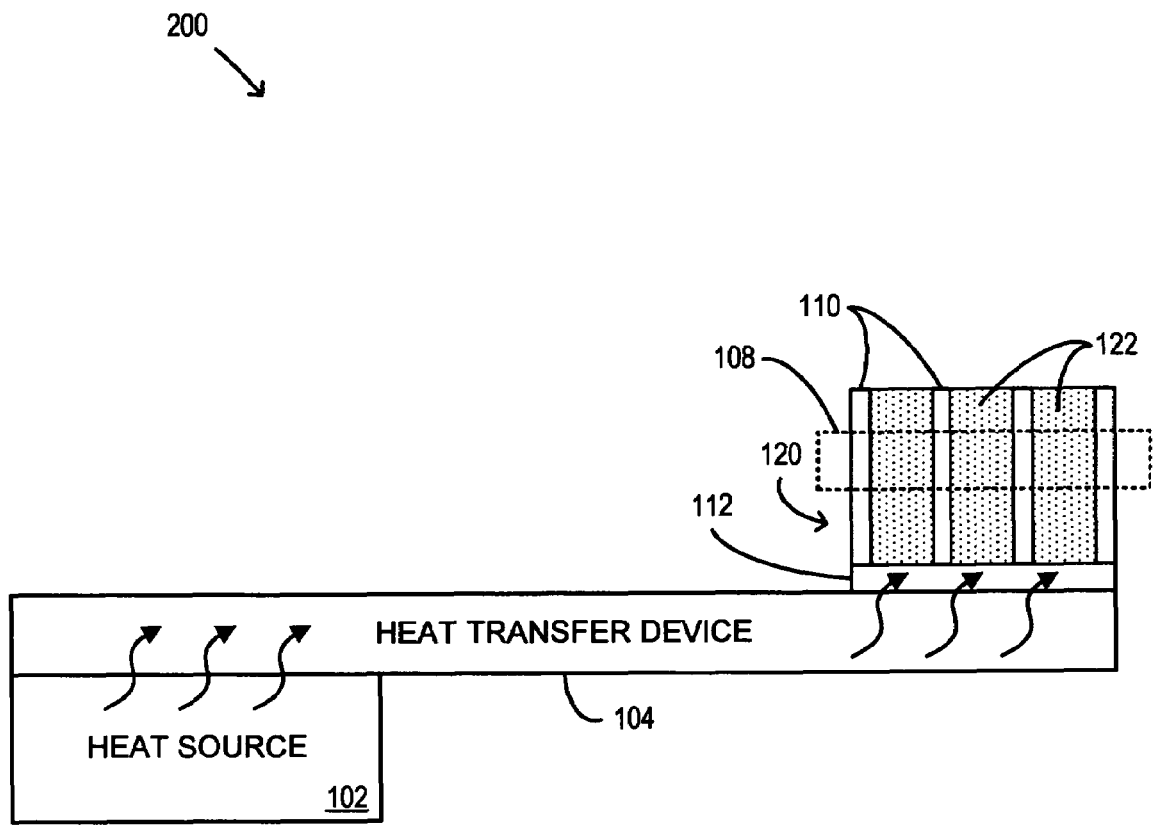
FIG. 5 is a flow diagram of an apparatus according to some embodiments.

Referring now to FIG. 5, a block diagram of an apparatus 200 according to some embodiments is shown. The apparatus 200 may include a heat source 102, a heat transfer device 104, an enhanced remote heat exchanger 120 having a porous medium 122 sandwiched between adjacent fins 110, and a fan 108 for blowing air through the porous medium 122. In some embodiments the components 102, 104, 108, 120 of the apparatus 200 may be components as described herein in conjunction with FIGS. 1–3. Also according to some embodiments, fewer or more components may be included in and/or attached to the apparatus 200. For example, one or more heat sources 102, heat transfer devices 104, enhanced remote heat exchangers 120, fans 108, and/or any combination thereof may be parts of the apparatus 200.

The heat source 102 generally gives off and/or otherwise generates heat that requires dissipation. The heat may travel into a heat transfer device 104 attached and/or adjacent to the heat source 102. In some embodiments, the heat may then travel along and/or through the heat transfer device 104 to a location remote from the heat source 102. The heat may then flow into the base 112 of an enhanced remote heat exchanger 120, and into the fins 110 and porous medium 122 of the enhanced remote heat exchanger 120. Heat may then emanate from the various surface areas of the fins 110 and porous medium 122. In some embodiments a fan 108 may be used to blow air between the fins 110 and through the porous medium 122, to remove heated air from the enhanced remote heat exchanger 120. The fan 108 in FIG. 5 is shown located behind the enhanced remote heat exchanger 120 and may generally be oriented to blow air in a direction parallel to the fins 110 and through the porous medium 122. The apparatus 200 may, according to some embodiments, be an enhanced heat exchanger for removing heat from portable electronic devices such as notebook computers.

The porosity of the porous medium 122 may generally be very high. Some metal foams, for example, may have porosities of around ninety percent or even as high as ninety-five percent. Porous mediums 122 may therefore generally weigh very little. The use of porous mediums 122 in an enhanced heat exchanger 120 may, according to some embodiments, provide a lighter-weight heat exchanger than would otherwise be possible. Notebook computers and other portable electronics are weight-sensitive devices that could benefit from the reduced weight of an enhanced heat exchanger 120. Also according to some embodiments, the pore size of the porous material 122 may be selected to provide enhanced heat dispersion without changing the porosity. For example, a metal foam 122 may have a pore size of between five and twenty pores per inch (PPI). In some embodiments, a metal foam with a pore size of twenty PPI may, for example, be chosen because it provides for enhanced heat dispersion.

The fan 108 may be or include one or more blower fans located in a notebook computer or other portable computing device. Blower fans are generally characterized as providing low air flows, but being able to create high pressure differentials (or pressure head). Blower fans may generally save vertical space when used in portable electronics such as notebook computers because their configuration allows them to be mounted adjacent to, instead of on top of, a component (such as a heat exchanger) requiring air flow. In some embodiments, the pressure differential created by a blower fan 108 may assist in dispersing heat from the enhanced remote heat exchanger 120. For example, the pressure differential created by the blower fan 108 may cause the formation of eddies and/or flow vortices on the trailing edge of the enhanced remote heat exchanger 120. The eddies and/or vortices may, according to some embodiments, promote thermal dispersion by dissipating heated air adjacent to the enhanced remote heat exchanger 120.

Figure 6:
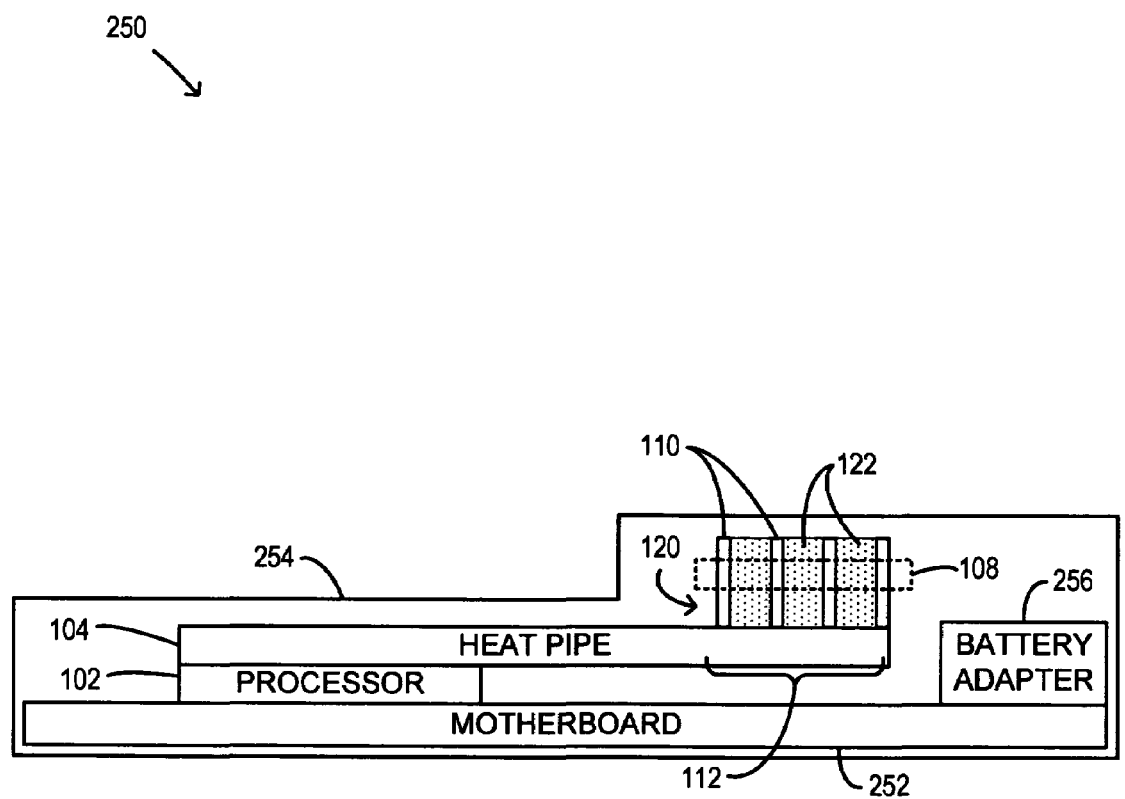
FIG. 6 is a block diagram of a system according to some embodiments.

FIG. 6 shows a block diagram of a system 250 according to some embodiments. The system 250 may generally include a motherboard 252, a processor 102 attached to the motherboard 252, a heat pipe 104 for removing heat from the processor 102, and an enhanced remote heat exchanger 120 utilizing a porous medium 122 for dissipating heat from the heat pipe 104. The system 250 may also include a blower fan 108 for forcing air through the enhanced remote heat exchanger 120, a battery adapter 256 to provide battery power to the system 250, and a casing 254 for housing the system components. In some embodiments the system 250 may be or include a notebook computer or other portable electronic device or any other type or configuration of computing or electronic device including, but not limited to, a desktop computer and a computer server. For example, the motherboard 252 may be the system board of a notebook computer, the processor 102 may be a Mobile Intel® Pentium® 4 Processor as described herein, the battery adapter 256 may be an adapter that allows the notebook computer to be powered by a rechargeable or non-rechargeable battery, and the casing 254 may be the chassis of the notebook computer. The system 250 may be used, for example, to dissipate heat in accordance with the method 150 described herein in conjunction with FIG. 4.

According to some embodiments, heat generated by the processor 102 is removed from the processor 102 by the heat pipe 104. The remote end of the heat pipe 104 may, for example, form the base 112 of the enhanced remote heat exchanger 120. Heat may therefore flow through the base 112 into the fins 110 and porous medium 122 of the enhanced remote heat exchanger 120 where it is dissipated into the air within the casing 254. The blower fan 108 may force air over and through the enhanced remote heat exchanger 120, creating a pressure differential across the enhanced remote heat exchanger 120. The heated air surrounding the enhanced remote heat exchanger 120 is expelled by the blower fan 108 and, in some cases, is forced through a vent or other opening in the casing 254.

Larger and/or more powerful blower fans 108 may, in some embodiments, be used to create higher pressure differentials across the enhanced remote heat exchanger 120 and promote further thermal dispersion efficiency. Higher air flows may generally increase acoustic noise however, and the size of the fan 108 that may be employed in a notebook computer, for example, may be limited based on the amount of noise that is acceptable to produce. According to some embodiments however, the flow of air through the porous medium 122 may produce noise in the broad band range (acoustic energy distributed over a wide range of frequencies). As compared to the noise that may be produced by blowing air through a heat sink 106 (from FIG. 2), the broad band noise created by blowing air through the enhanced remote heat exchanger 120 may be less irritating to the human ear. Some embodiments may therefore allow larger fans 108 to be used than would normally be acceptable, further increasing the effectiveness of the enhanced remote heat exchanger 120.

The several embodiments described herein are solely for the purpose of illustration. Persons skilled in the art will recognize from this description that other embodiments may be practiced with modifications and alterations limited only by the claims.

What is claimed is:

1. An apparatus, comprising:
   a heat transfer portion to receive heat from a heat source and to transfer heat from the heat source; and
   a remote heat sink adjacent to the heat transfer portion to remove heat from the heat transfer portion, the remote heat sink including:

a solid metal portion that extends away from the heat transfer portion; and a porous medium coupled to the solid metal portion, wherein the porous medium extends away from the solid metal portion such that a thermal boundary layer exists in substantially the entire porous medium.

2. The apparatus of claim 1, further comprising:

a blower fan to force air toward the remote heat sink.

3. The apparatus of claim 2, wherein the blower fan produces a pressure differential across the remote heat sink.

4. The apparatus of claim 1, wherein the solid metal portion includes:

a plurality of solid metal portions that extend away from the heat transfer portion.

5. The apparatus of claim 4, wherein the solid metal portions are fins.

6. The apparatus of claim 5, wherein the fins are substantially parallel to each other.

7. The apparatus of claim 5, wherein the porous medium is attached between two fins.

8. The apparatus of claim 7, wherein the attachment is via compression.

9. The apparatus of claim 7, wherein the attachment is via a thermally conductive adhesive.

10. The apparatus of claim 1, wherein the heat source is a processor.

11. The apparatus of claim 1, wherein the heat transfer portion is at least one of a heat pipe, a pumped loop, and a refrigeration loop.

12. The apparatus of claim 1, wherein the porous medium is a metal foam.

13. The apparatus of claim 1, wherein the porous medium has a porosity near ninety percent.

14. The apparatus of claim 1, wherein the porous medium has a pore density of five pores per inch.

15. A method, comprising:

transferring heat from a heat source using a heat transfer device adjacent to the heat source; and dissipating heat from the heat transfer device using a remote heat sink adjacent to the heat transfer device, the remote heat sink having:

a solid metal portion that extends away from the heat transfer portion; and a porous medium coupled to the solid metal portion, wherein the porous medium extends away from the solid metal portion such that a thermal boundary layer exists in substantially the entire porous medium.

16. The method of claim 15, further comprising:

using forced convection to increase the dissipation of heat.

17. The method of claim 16, wherein the forced convection is accomplished using a blower fan operable to direct air through the porous medium such that the air enters a first side of the porous medium and exists a second and opposing side of the porous medium.

18. The method of claim 16, wherein the porous medium is a metal foam.

19. A system, comprising:

a substrate;

an electronic component mounted on the substrate;

a heat transfer device to receive heat from the electronic component and to transfer heat from the electronic component;

a remote heat sink adjacent to the heat transfer device to remove heat from the heat transfer device, the remote heat sink including:

a plurality of fins extending away from the heat transfer device; and a porous medium attached between the plurality of fins such that a thermal boundary layer exists in substantially the entire porous medium;

a blower fan to expel heated air from the system; and a battery adapter to provide battery power to at least one of the electronic component and the blower fan.

20. The electronic system of claim 19, wherein the porous medium is a metal foam.

21. The electronic system of claim 19, wherein the porous medium has a porosity near ninety percent.

22. The electronic system of claim 19, wherein the porous medium has a pore density of five pores per inch.

23. The electronic system of claim 19, wherein the substrate is a circuit board.

24. The electronic system of claim 19, wherein the electronic component is a processor.

25. The electronic system of claim 19, wherein the electronic system is a portable computer.

* * * * *